(12) United States Patent
Wang et al.

(10) Patent No.: US 8,305,748 B2
(45) Date of Patent: Nov. 6, 2012

(54) BLADE SERVER MODULE

(75) Inventors: Shi-Feng Wang, Shanghai (CN); Ji-Peng Xu, Shanghai (CN); Tsai-Kuei Cheng, Taipei (TW)

(73) Assignee: Inventec Corporation, Taipei (TW)

( * ) Notice: Subject to any disclaimer, the term of this patent is extended or adjusted under 35 U.S.C. 154(b) by 254 days.

(21) Appl. No.: 12/908,294

(22) Filed: Oct. 20, 2010

(65) Prior Publication Data

US 2012/0026671 A1 Feb. 2, 2012

(30) Foreign Application Priority Data

Jul. 30, 2010 (CN) .......................... 2010 1 0244516

(51) Int. Cl.
*G06F 1/16* (2006.01)
(52) U.S. Cl. ................. 361/679.32; 312/330.1; 165/247; 454/259; 248/346.01
(58) Field of Classification Search ............... 312/223.1, 312/223.2, 330.1; 165/80.3, 104.31, 104.13, 165/104.33, 247; 454/229, 256, 259; 248/65, 248/74.1, 74.3, 346.01; 455/575.1, 457, 455/426.1, 456.1, 557, 552.1; 361/801, 679.02, 361/679.33, 679.32, 679.22, 679.57, 679.4, 361/679.31, 679.46, 679.37, 679.49, 679.54, 361/679.41
See application file for complete search history.

(56) References Cited

U.S. PATENT DOCUMENTS

| | | | | |
|---|---|---|---|---|
| 2010/0271766 | A1* | 10/2010 | Lin | ........................... 361/679.02 |
| 2012/0113581 | A1* | 5/2012 | Anguiano-Wehde et al. | ........................ 361/679.33 |

* cited by examiner

*Primary Examiner* — Hung Duong
(74) *Attorney, Agent, or Firm* — Peter F. Corless; Steven M. Jensen; Edwards Wildman Palmer LLP

(57) ABSTRACT

A blade server module applicable to be inserted into a blade server system. The blade server module includes a motherboard tray having a first connector, a motherboard, an extension dock and an adaptor card having a second connector corresponding to the first connector and electrically connect to the first connector via a cable so as to connect the motherboard and the adaptor card. Compared with prior arts, since utilization of the cable, the blade server module is not restricted by smaller motherboard and more and more concentrative electronic elements. Since arrangement of the cable does not occupy space of the motherboard and connects the motherboard and the adaptor card integrally, signals of the motherboard output via the adaptor card and then link the inserted blade server system. Hence the blade server module of the present invention efficiently decreases overall manufacturing cost and its occupation volume.

10 Claims, 4 Drawing Sheets

BLADE SERVER MODULE

CROSS-REFERENCES TO RELATED APPLICATIONS

This application claims under 35 U.S.C. §119(a) the benefit of Chinese Application No. 201010244516.2, filed Jul. 30, 2010, the entire contents of which is incorporated herein by reference.

BACKGROUND OF THE INVENTION

1. Field of the Invention

This invention relates to blade server modules, and more particularly, to a blade server module applicable to be inserted into a blade server system.

2. Description of Related Art

In a blade server system, a blade module is the most important composition part. The blade module generally comprises a motherboard and a carrying dock carrying the motherboard. The whole blade module is completely inserted into the blade server system. The motherboard is electrically connected to the blade server system via a gold finger and a connector on the motherboard. However, volume of the motherboard of the blade module is more and more small, electronic elements on it are more and more concentrative. Specifically, typical connection of the motherboard and the blade server system is via the gold finger or the connector. However, arrangement of many elements and layout of signals on the motherboard are all under requirements, for instance, line length, line width, line distance, impedance, time and electromagnetic interference, etc. Otherwise, signal quality is affected and then the blade module even the whole blade server system operation. Hence, arrangement and layout of the elements of the motherboard are more and more difficult, and manufacturing cost of the circuit board is still high, at the same time, miniaturization development of the blade module is effected. Therefore, how to decrease design and manufacturing cost of the blade module of the blade server system and volume of the blade module in order overcome the various previously-mentioned problems is an issue in the modern industry waiting for being resolved immediately.

SUMMARY OF THE INVENTION

In view of the above-mentioned problems of the prior art, it is a primary objective of the present invention to provide a blade server module with low cost and small volume.

To achieve the above-mentioned and other objectives, the present invention discloses a blade server module applicable to be inserted into a blade server system, the blade server module comprising: a motherboard tray having a bottom plate and a front panel perpendicular in position to the bottom plate and formed on a first end of the motherboard tray; a motherboard placed on the bottom plate and having at least one first connector; an extension dock fastened to a second end of the motherboard tray; and an adaptor card placed on the extension dock and having at least one second connector corresponding to the first connector, wherein the second connector is electrically connected to the first connector via a cable, and an end of the adaptor card away from the motherboard has a gold finger electrically connected to the second connector for being inserted into the blade server system.

The blade server module in accordance with an embodiment of the present invention further comprises a PCI module fastened to the first end of the motherboard tray, wherein the PCI module comprises: a PCI support disposed above the motherboard, wherein the PCI support is fastened to the front panel via one end thereof and fastened on a side of the motherboard tray via the other end thereof; a PCI card disposed on the PCI support and electrically connected to the motherboard. The second end of the motherboard tray further has a folding edge perpendicular to the bottom plate, the extension dock is riveted on the folding edge, and a bottom surface of the extension dock is parallel to a bottom surface of the bottom plate. An end of the extension dock away from the motherboard tray forms an indent, and the gold finger is exposed out of the indent.

Additionally, the blade server module further comprises a battery carrier spanning the motherboard and the adaptor card for carrying a battery, wherein the battery carrier comprises: a carrying portion having a first surface facing the motherboard and a second surface away from the motherboard, wherein the first surface is separated from an upper surface of the motherboard at a distance greater than a height of an electronic element installed on the motherboard as well under the carrying portion, and the battery is locked and positioned on a second surface of the carrying portion; and a first fastening foot and a second fastening foot respectively extend and protrude from the first surface of the carrying portion, wherein bottoms of the first fastening foot and the second fastening foot are respectively fastened to upper surfaces of the motherboard and the adaptor card, and each of the bottoms has at least one first fastening hole, so as to fasten the carrying portion on the motherboard and the adaptor card by screws passing through these first fastening holes.

Furthermore, the first fastening foot perpendicularly extends from a peripheral region of the first surface of the carrying portion toward the motherboard tray. The carrying portion has an operating hole corresponding to the second fastening foot and communicating with the first and second surfaces of the carrying portion, and therefore the screws pass through the operating hole so as to fasten the second fastening foot. The motherboard and the adaptor card respectively have at least one second fastening hole for fastening the motherboard on the motherboard tray and the adaptor card on the extension dock via the second fastening holes, the first fastening hole of the first fastening foot corresponds in position to the second fastening hole of the motherboard, and the first fastening hole of the second fastening foot corresponds to the second fastening hole of the adaptor card.

The blade server module in accordance with another embodiment of the present invention further comprises a wind guiding plate, wherein the blade server system has a heat dissipating fan module and the motherboard further has a CPU and a plurality of memories positioned side by side, wherein a bottom of the wind guiding plate is fastened on the adaptor card, an end of the wind guiding plate is fixed between two of the memories closest to the CPU such that the memories closest to the CPU and the wind guiding plate form a wind guiding surface, and the other end of the wind guiding plate forms an extension portion extending to the heat dissipating fan module and bending to direction of the memories. The bottom of the wind guiding plate has a third fastening hole, the wind guiding plate is fastened on the adaptor card via screws passing through the third fastening hole, the adaptor card further has at least one fourth fastening hole to fasten the adaptor card on the extension dock via the fourth fastening hole, and the third fastening hole of the wind guiding plate corresponds in position to the fourth fastening hole of the adaptor card.

Known by previous description, the blade server module of the present invention applicable to be inserted into a blade server system comprises the motherboard tray, the motherboard, the extension dock and the adaptor card. The motherboard has the first connector, the adaptor card has the second connector corresponding to the first connector, wherein the second connector is electrically connected to the first connector via the cable so as to connect the motherboard and the adaptor card. Compared with prior arts, since utilization of the cable, the blade server module of the present invention is not restricted by smaller motherboard and more and more concentrative electronic elements. Since arrangement of the cable does not occupy space of the motherboard and connects the motherboard and the adaptor card integrally, signals of the motherboard output via the adaptor card and then link the inserted blade server system. Hence the blade server module of the present invention efficiently decreases overall manufacturing cost and its occupation volume.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification.

Figure 1:
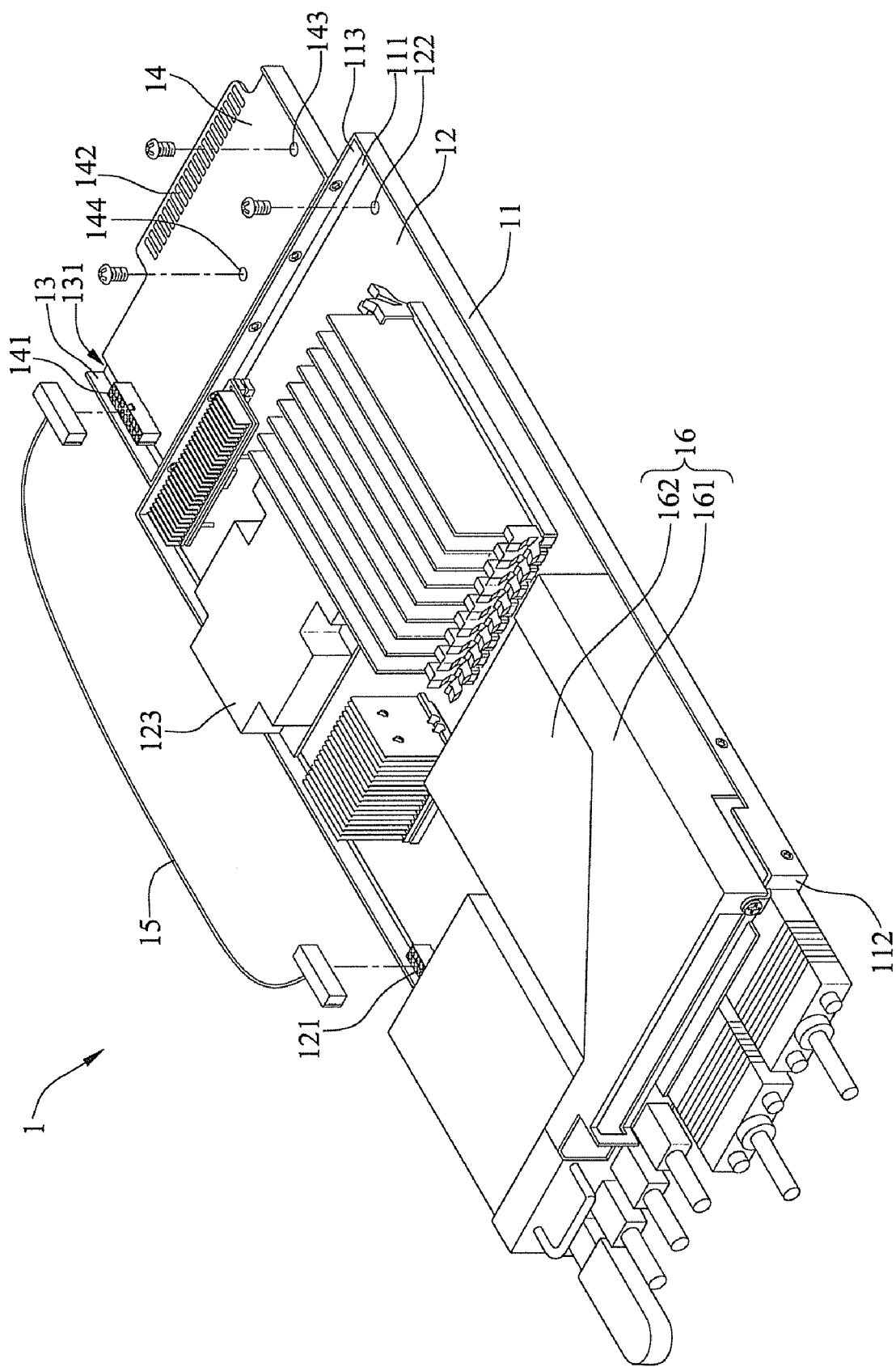
FIG. 1 is a schematic diagram of a blade server module in accordance with an embodiment of the present invention.

Please refer to FIG. 1 showing a schematic diagram of a blade server module in accordance with an embodiment of the present invention. As illustrated, in the embodiment, a blade server module 1 of the present invention applicable to be inserted in a blade server system has beneficial effects of decreasing volume and cost down as following description. The blade server module 1 comprises at least a motherboard tray 11, a motherboard 12, an extension dock 13 and an adaptor card 14. The blade server module 1 may comprise other components.

In the embodiment, the motherboard tray 11 is a bottom plate 111 and a front panel 112 perpendicular to the bottom plate 111 and bended from a board. The front panel 112 extends from a first end of the motherboard tray 11. The motherboard 12 has, but not limit to, a CPU 123 and a memory 124. The motherboard 12 is horizontally placed on the bottom plate 111. The motherboard 12 has a first connector 121 in a slot form for inputting/outputting signals in/from the motherboard 12. The extension dock 13 is fixed on a second end of the motherboard tray 11 by, but not limit to, rivets. The extension dock 13 fixed on the motherboard tray 11 may be performed through other combination mechanism, for instance, screwing.

The adaptor card 14 is horizontally placed on the extension dock 13 and corresponds to the first connector 121. The adaptor card 14 having a second connector 141 in a slot form and a gold finger 142 provided on an end of the adaptor card 14 away from the motherboard 12 is inserted in the blade server system via the gold finger 142. It should be illustrated that the gold finger 142 electrically connected to the second connector 141 is used as a signal delivering route for the blade server module 1 and the blade server system.

The motherboard 12 and the adaptor card 14 have respectively at least a second fastening hole 122, 143. The motherboard 12 and the adaptor card 14 are respectively locked on the motherboard tray 11 and the extension dock 13 via the fastening holes 122, 143. The adaptor card 14 further has at least a fourth fastening hole 144. The adaptor card 14 is locked on the extension dock 13 via the fourth fastening hole 144.

Additionally, the first and second connector 121, 141 electrically connect with each other via a cable 15. Electrical connection between the motherboard 12 and the adaptor card 14 may be accomplished via the cable 15 such that signal output of the motherboard 12 is through the gold finger 142 of the adaptor card 14. Accordingly, the motherboard 12 communicates with the server system which is inserted with the motherboard 12 through the gold finger 142 of the adaptor card 14.

It should be illustrated that since conductivity of a cable is much stable, signal delivering does not over distort under effect of delivering route length. For example, over distortion does not occur under effect of delivering route length if transmit a SATA signal of a North-Bridge chip of a motherboard via a cable, that is, signals transmitted by cables will satisfy demand of a motherboard about element arrangement and line length, line width, line distance, impedance, timing and electromagnetic interference related to signals. Moreover, since cable layout does not occupy space of a motherboard, it is not restricted by smaller motherboard volume and concentrative electrical elements. Hence, the blade server module decreases difficulty of arrangement and layout of electrical elements on the blade module according to utilization of cable, thereby decreasing design and manufacturing cost of the blade server module and its volume, so as to overcome various problems in prior arts.

In order to enhance the structure of the motherboard tray 11 and provide connection mechanism with the extension dock 13, the second end of the motherboard tray 11 is bended to form a folding edge 113 perpendicular to the bottom plate 111. In the embodiment, the extension dock 13 is fixed on the folding edge 113 such that bottom surface of the extension dock 13 is parallel to a bottom surface of the bottom plate 111. In the embodiment, in order to simplify manufacturing process and decrease cost, it is not restricted that the folding edge 113 is directly bended from the board consisting the motherboard tray 11, and connection of the motherboard tray 11 and the extension dock 13 is achieved by riveting method.

Moreover, in the embodiment, the blade server module 1 further comprises a PCI module 16 disposed on the first end of the motherboard tray 11 by screwing. Particularly, the PCI module 16 comprises a PCI support 161 and a PCI card 162. The PCI support 161 is disposed over the motherboard 12 to avoid interference between the PCI support 161 and the motherboard 12. The PCI support 161 is fastened on the front panel 112 via one end thereof and fastened on a side of the motherboard tray 11 via the other end thereof to posit the PCI module 16 over the motherboard 12. The PCI support 161 has a notch opening to one side for installation of varies specifications of the PCI card 162, for instance, FHHL (Fortis Healthcare Holdings Limited) and LP (Low-Profile) and the like PCI cards, and for providing electrical connection of the PCI card 162 and the motherboard 12 such that the blade server module 1 is much more comprehensively applicable and function selectivity for users is more powerful without designing different blade server modules of different machine types so as to efficiently cost down and increase product competitiveness.

However, the form of the PCI support 161 is not restricted by this, and it may be changed according to design of the blade server module. Properly, the PCI support 161 may be fastened on the motherboard tray 11, but not limit, via screws. The PCI support 161 may be connected to the motherboard tray 11 via selectively other connection mechanisms, for instance, gluing, riveting or soldering.

In the embodiment, the extension dock 13 has an indent 131 for exposing the gold finger 142 of the adaptor card 14 such that the blade server module 1 is inserted into the blade server system through the gold finger 142. Additionally, because the gold finger 142 of the adaptor card 14 is away from the direction of the motherboard tray 11, the gold finger 142 could pass through the indent 131 to expose, but not limitation.

Figure 2:
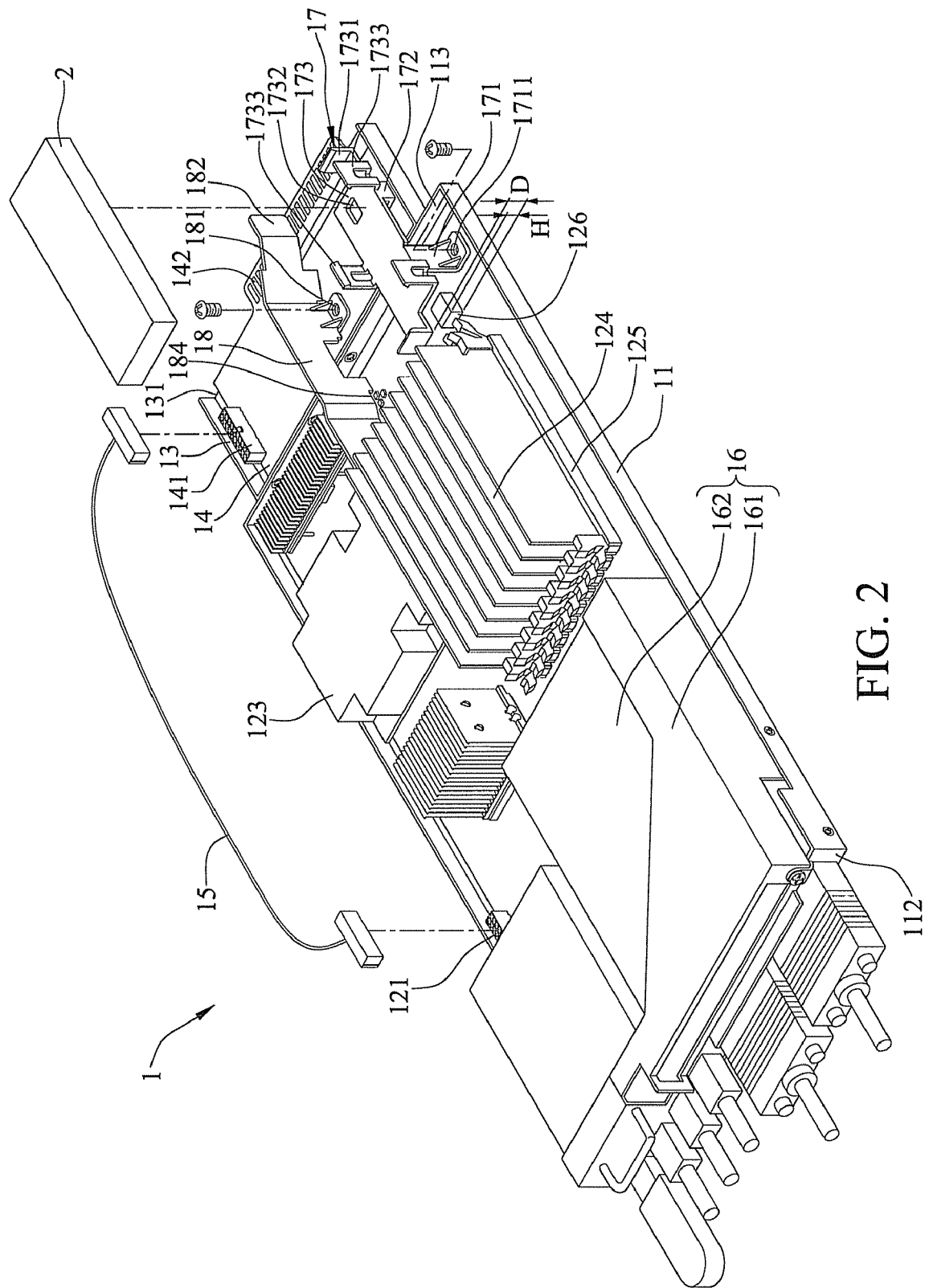
FIG. 2 is an exploded view of the blade server module in accordance with another embodiment of the present invention.
Figure 3:
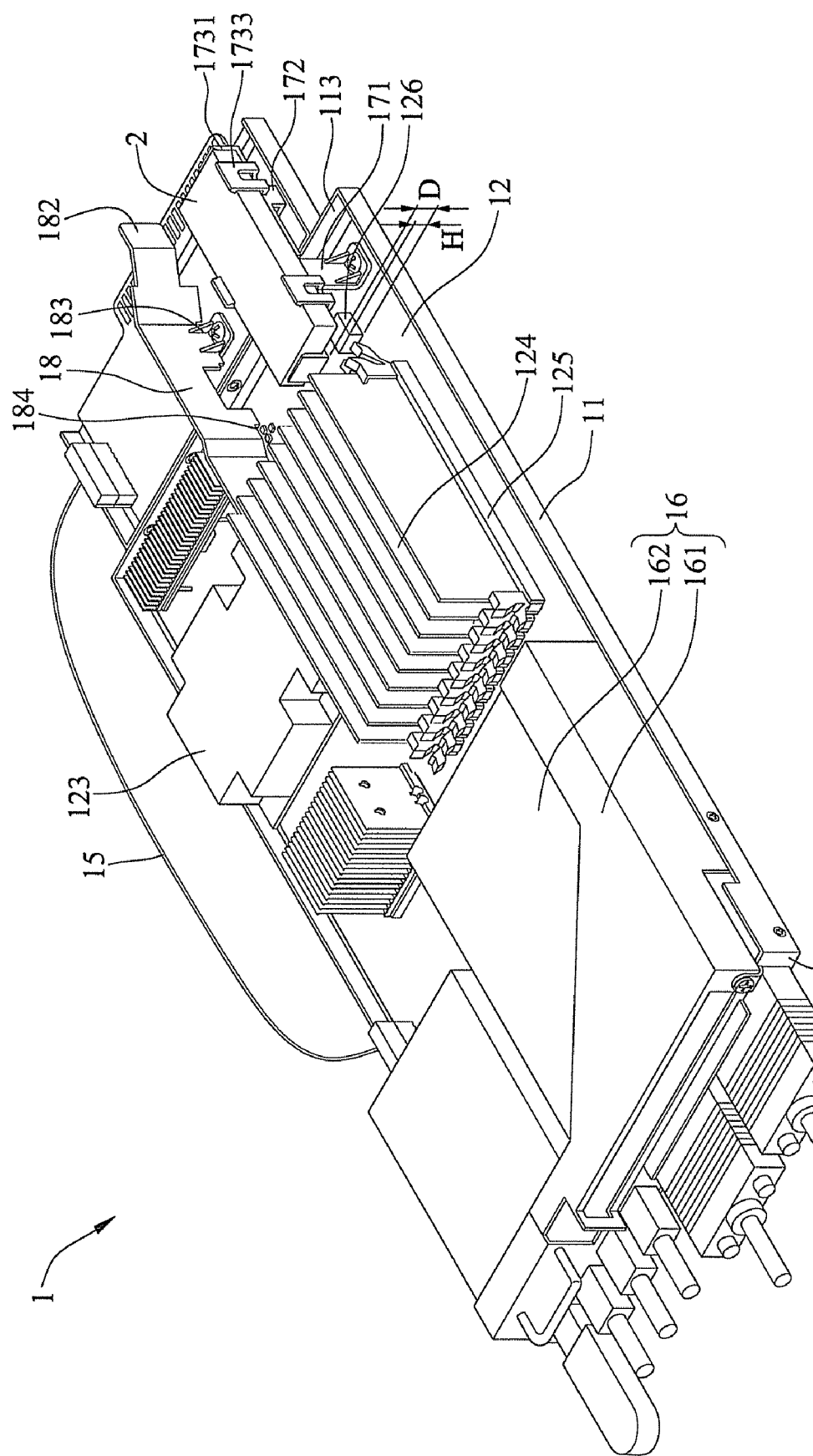
FIG. 3 is a combination diagram of the blade server module shown in FIG. 2.
Figure 4:
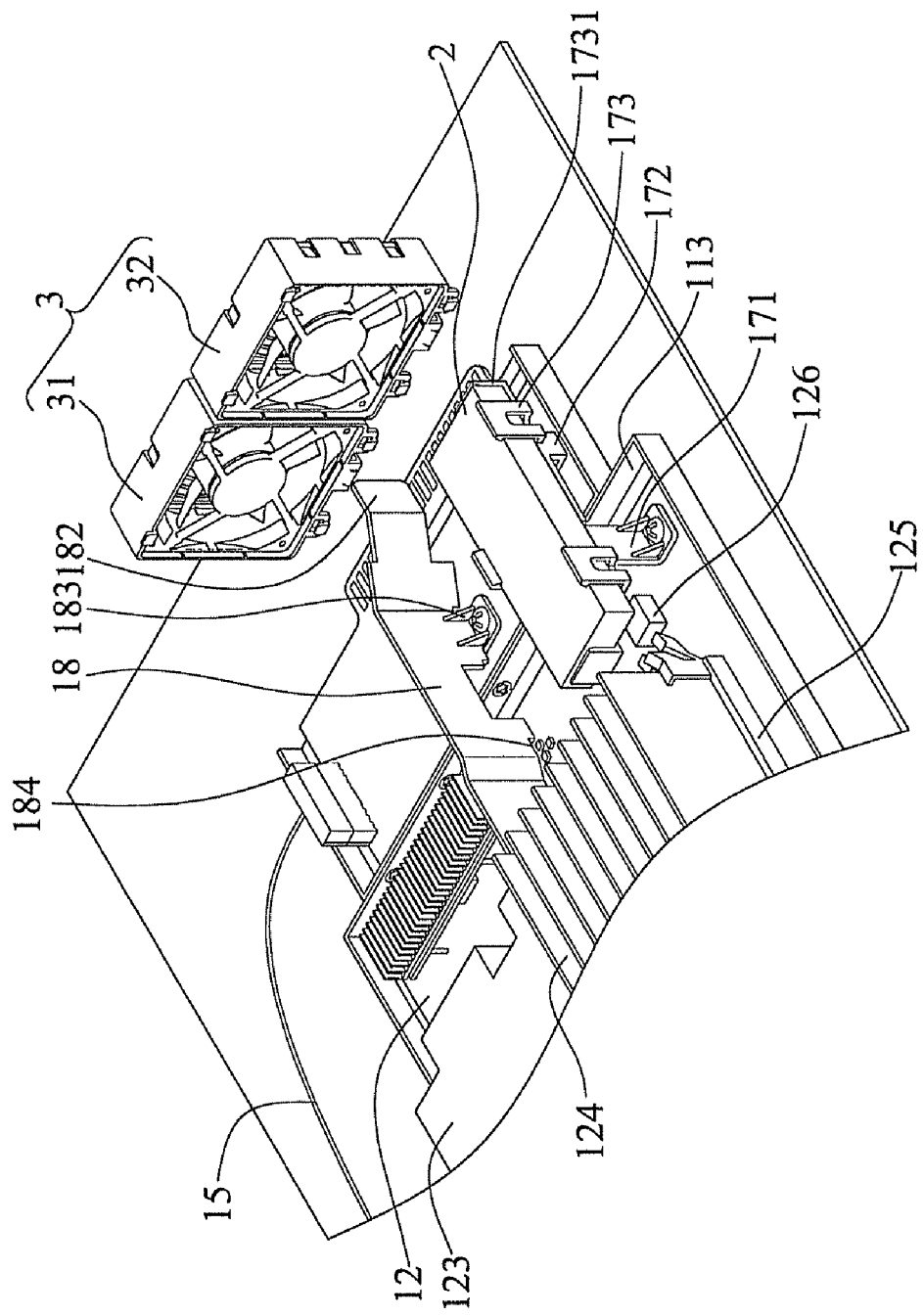
FIG. 4 is a partial combination diagram of the blade server module shown in FIG. 3.

Please refer to FIGS. 2, 3 and 4 are stereo diagrams of the blade server module 1 in accordance with another embodiment of the present invention. Difference between this embodiment and the previous one is just provision of a battery carrier and a wind guiding plate. Since rest designs are approximately the same, the same part of description of structure and motion way is not repeated. The following description is specifically described an explanation of different parts for avoiding confusion donation of similar and equivalent elements.

As shown in FIG. 2, the blade server module 1 further comprise a battery carrier 17. The battery carrier 17 spanning the motherboard 12 and the adaptor card 14 with its two ends is used for executing activity by providing a battery 2 to install thereon. In the embodiment, the motherboard 12 further comprises a CPU 123 and a plural of memories 124 side by side. The battery carrier 17 comprises, but not limit to, at least a carrying portion 173, a first fastening foot 171 and a second fastening foot 172.

The carrying portion 173 has a first surface facing the motherboard 12 and a second surface away from the motherboard 12. The first surface spaces from an upper surface of the motherboard 12 at a distance D greater than a height H of an electronic element 126 installed on the upper surface of the motherboard 12 as well under the carrying portion 173. The carrying portion 173 further comprises a plurality of limiting sheets 1731 and hooks 1733. The limiting sheets 1731 extend from front and back ends of the second surface of the carrying portion 173 and are used for restricting forward and backward movement of the battery 2. These hooks 1733 extend from left and right edges of the second surface of the carrying portion 173 and are used for jamming and positioning the battery 2 on the second surface of the carrying portion 173. Specifically, these limiting sheets 1731 and hooks 1733 vertically extend from the second surface of the carrying portion 173 in a direction away from the motherboard 12.

These first and second fastening foots 171, 172 are respectively extended from the first surface of the carrying portion 173, wherein the fastening foot 171, 172 are respectively pasted on upper surfaces of the motherboard 12 and the adaptor card 14 with their bottoms, and respectively have at least a first fastening hole 1711. Fixing the carrying portion 173 over the motherboard 12 and the adaptor card 14 with a specific height via screws passing through these first fastening holes 1711 in order to avoid generating poor condition of interference to the carrying portion 173 with the motherboard 12 and the adaptor card 14.

In the embodiment, it is not restricted that the first fastening foot 171 vertically extends from peripheral part of the first surface of the carrying portion 173 toward the motherboard tray 11 and the second fastening foot 172 vertically extends from central part of the first surface of the carrying portion 173 toward the extension dock 13. Additionally, the carrying portion 173 has an operating hole 1732 at a position corresponding to the second fastening foot 172 that communicates with the first and second surfaces, and therefore screws pass through the operating hole so as to fasten the second fastening foot 172. As illustrated, the second fastening foot 172 is locked on the extension dock 13 by passing through screws (not shown) of the operating hole 1732.

The blade server module 1 is applicable to be inserted into a blade server system having a heat dissipating fan module 3, wherein the blade server module 1 further has a wind guiding plate 18.

As illustrated in FIG. 4, the heat dissipating fan module 3 has a first dissipating fan 31 and a second dissipating fan 32. The first dissipating fan 31 generates dissipating wind forward the CPU 123, and the second dissipating fan 32 generates dissipating wind forward the memory 124.

As illustrated in FIGS. 3 and 4, the wind guiding plate 18 is fastened on the adaptor card 14 with its bottom and seized between two of these memories 124 which are closest to the CPU 123 with its one end such that the memory 124 closest to the CPU 123 and the wind guiding plate 18 jointly form a wind guiding surface. As illustrated in FIG. 3, the blade server module 1 further comprises a plurality of memory slots 125 for the memories to be inserted therein so as to provide for one end of the wind guiding plate 18 to be seized between two of these memory slots 125 which are adjacent.

An extension portion 182 is formed on another end of the wind guiding plate 18. The extension portion 182 extends to the heat dissipating fan module 3, is bended toward the memories 124, and extends to neighborhood of the second dissipating fan 32 in direction being away from the CPU 123 so as to guide part dissipating wind generated from the second dissipating fan 32 to the CPU 123.

As illustrated in FIG. 2, the bottom of the wind guiding plate 18 has an ear base 183 for pasting on the adaptor card 14. The ear base 183 has a third fastening hole 181. The wind guiding plate 18 is locked on the adaptor card 14 by screws passing through the third fastening hole 181. The adaptor card 14 is disposed between the motherboard 12 and the dissipating fan module 3. The bottom of the wind guiding plate 18 further has an dodging portion 184 for the wind guiding plate 18 to prevent from generating interference with respect to electronic elements arranged on the motherboard 12.

In conclusion, the blade server module of the present invention applicable to be inserted into a blade server system comprises the motherboard tray, the motherboard, the extension dock and the adaptor card, wherein the motherboard has a first connector, the adaptor card has a second connector corresponding to the first connector, and the first and second connectors electrically connect to each other via cable, hence connecting the motherboard and the adaptor card. Compared with prior arts, since utilization of the cable, the blade server module of the present invention is not restricted by smaller motherboard and more and more concentrative electronic elements. Since arrangement of the cable does not occupy space of the motherboard and connects the motherboard and the adaptor card integrally, signals of the motherboard output via the adaptor card and then link the inserted blade server system. Hence the blade server module of the present invention decreases overall manufacturing cost and its occupation volume.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A blade server module applicable to be inserted into a blade server system, comprising:
   a motherboard tray having a bottom plate and a front panel perpendicular in position to the bottom plate and formed on a first end of the motherboard tray;
   a motherboard placed on the bottom plate and having at least one first connector;
   an extension dock fastened to a second end of the motherboard tray; and
   an adaptor card placed on the extension dock and having at least one second connector corresponding to the first connector, wherein the second connector is electrically connected to the first connector via a cable, and an end of the adaptor card away from the motherboard has a gold finger electrically connected to the second connector for being inserted into the blade server system.

2. The blade server module of claim 1, further comprising a PCI module fastened to the first end of the motherboard tray and comprising:
   a PCI support disposed above the motherboard and fastened to the front panel via one end thereof and fastened to a side of the motherboard tray via the other end thereof; and
   a PCI card disposed on the PCI support and electrically connected to the motherboard.

3. The blade server module of claim 1, wherein the second end of the motherboard tray further has a folding edge perpendicular to the bottom plate, wherein the extension dock is riveted on the folding edge, such that a bottom surface of the extension dock is parallel to a bottom surface of the bottom plate.

4. The blade server module of claim 1, wherein the extension dock has an indent formed on an end thereof away from the motherboard tray, and the gold finger is exposed out of the indent.

5. The blade server module of claim 1, further comprising a battery carrier spanning the motherboard and the adaptor card for carrying a battery, the battery carrier comprising:
   a carrying portion having a first surface facing the motherboard and a second surface away from the motherboard, wherein the first surface is separated from an upper surface of the motherboard at a distance greater than a height of an electronic element installed on the upper surface of the motherboard as well under the carrying portion, and the battery is locked and positioned on the second surface of the carrying portion; and
   a first fastening foot and a second fastening foot respectively extending and protruding from the first surface of the carrying portion, wherein bottoms of the first fastening foot and the second fastening foot are respectively fastened to upper surfaces of the motherboard and the adaptor card, and each of the bottoms has at least one first fastening hole, so as to fasten the carrying portion to the motherboard and the adaptor card with screws that pass through the first fastening holes.

6. The blade server module of claim 5, wherein the first fastening foot vertically extends from a peripheral region of the first surface of the carrying portion toward the motherboard tray, and the second fastening foot vertically extends from a central region of the first surface of the carrying portion toward the extension dock.

7. The blade server module of claim 6, wherein the carrying portion has an operating hole corresponding to the second fastening foot and communicating with the first and second surfaces of the carrying portion, such that the screws pass through the operating hole to fasten the second fastening foot.

8. The blade server module of claim 5, wherein the motherboard and the adaptor card respectively have at least one second fastening hole for fastening the motherboard on the motherboard tray and the adaptor card on the extension dock via the second fastening holes, the first fastening hole of the first fastening foot corresponds in position to the second fastening hole of the motherboard, and the first fastening hole of the second fastening foot corresponds in position to the second fastening hole of the adaptor card.

9. The blade server module of claim 1, further comprising a wind guiding plate, wherein the blade server system has a heat dissipating fan module, the motherboard further has a CPU and a plurality of memories positioned side by side, a bottom of the wind guiding plate is fastened on the adaptor card, an end of the wind guiding plate is fixed between two of the memories closest to the CPU such that the memories closest to the CPU and the wind guiding plate form a wind guiding surface, and the other end of the wind guiding plate forms an extension portion extending to the heat dissipating fan module and bending to direction of the memories.

10. The blade server module of claim 9, wherein the bottom of the wind guiding plate has a third fastening hole, the wind guiding plate is fastened on the adaptor card via screws passing through the third fastening hole, the adaptor card further has at least one fourth fastening hole to fasten the adaptor card on the extension dock via the fourth fastening hole, and the third fastening hole of the wind guiding plate corresponds in position to the fourth fastening hole of the adaptor card.

* * * * *